United States Patent [19]

Van Den Brekel et al.

[11] Patent Number: 4,645,114
[45] Date of Patent: Feb. 24, 1987

[54] SHAPED SOLDER PAD FOR SURFACE MOUNTING ELECTRONIC DEVICES AND A SURFACE MOUNTING POSITION INCORPORATING SUCH SHAPED PADS

[75] Inventors: Jacques Van Den Brekel, Nepean; Carlyle W. Crothers, Kinburn; Dale B. Squires, North Gower, all of Canada

[73] Assignee: Northern Telecom Limited

[21] Appl. No.: 745,110

[22] Filed: Jun. 17, 1985

[51] Int. Cl.4 .............................................. B23K 35/14
[52] U.S. Cl. .................................. 228/56.3; 228/180.2
[58] Field of Search ............................ 228/56.3, 180.2

[56] References Cited

U.S. PATENT DOCUMENTS 3,614,832  10/1971  Chance et al. .................... 228/180.2

Primary Examiner—Nicholas P. Godici
Assistant Examiner—Karen Skillman
Attorney, Agent, or Firm—Sidney T. Jelly

[57] ABSTRACT

Solder pads for surface mounting of devices on a circuit board are given predetermined shapes. By shaping of a solder pad, or contact pad, a device will be held in, or moved to, a desired position on melting of the solder at the pad. Improved alignment and positioning is obtained. Broadly, a contact or solder pad comprises a rectangular portion and a segmental portion, the device end resting on the rectangular portion and the segmental portion being outside of the contact position.

8 Claims, 3 Drawing Figures

SHAPED SOLDER PAD FOR SURFACE MOUNTING ELECTRONIC DEVICES AND A SURFACE MOUNTING POSITION INCORPORATING SUCH SHAPED PADS

This invention relates to solder pads, for surface mounted devices, and particularly relates to a specific shaping of such pads for mounting, by reflow soldering on circuit boards. A feature of the invention is the ability to hold devices in place, on or under the surface of a circuit board, during soldering of further devices on the top surface of the circuit board.

A very large proportion of electronic devices are surface mounted on circuit boards. In such a process, a circuit pattern is defined on a circuit board, in copper, the copper pattern being afterwards tinned, to assist soldering amongst other reasons. Such circuit boards are generally referred to as printed circuit boards (PCB). In the circuit pattern lands are defined to which devices are to be soldered. The land sizes, and spacing, depend generally on the size of device to be mounted. Two lands may be provided for a device which is to be connected at each end. A pattern of lands may be provided for connection of leads, or contact pads, of encapsulated chips.

For good electrical connection it is desired that a device be centered upon the lands. Centering is also desirable to ensure satisfactory spacing of the devices. With conventional forms of circuit pattern, the contact pads for devices are usually rectangular. Although devices may be positioned so as to be aligned correctly, and are central on the contact pads, they can move prior to soldering. Positioning of the devices may also not be accurate and misalignment and off-center positioning occur. Soldering itself may also cause devices to move from the desired position.

The present invention is concerned with the specific shaping of contact pads. By suitable shaping of a contact pad, a device will be held in a desired position or moved to the desired position if mispositioned, on melting of the solder at the contact pad, during soldering. Substantial improvement in alignment and positioning is obtained. Broadly, in accordance with the invention, a contact comprises a body of solder having a defined shape, the shape composed of a rectangular portion and a segmental portion. The rectangular portion is positioned to receive the contact member or position on the device, while the segmental portion is outside the actual position of contact. Typically for a normal device connected at each end, a pad is provided for each end, the rectangular portions of the pads being innermost and the segmental portions being outside of the area occupied by the device. The segmental portions and rectangular portions are in alignment.

A further feature to which the present invention can also be applied, is the holding in position of devices on an undersurface of a circuit board, during reflow soldering of further devices on the top surface of the circuit board. By providing a predetermined amount of solder, related to the weight of the device, the device will stay in position on the undersurface even though the solder attaching it is molten.

The invention will be readily understood by the following description of certain embodiments, by way of example, in conjunction with the accompanying diagrammatic drawings, in which:

FIG. 1 illustrates a typical electronic device or component 10, which is rectangular in plan form, usually elongate, and is usually rectangular in cross-section viewed from an end. Each end of the device is "tinned" at 11, to assist in soldering.

Figure 2:
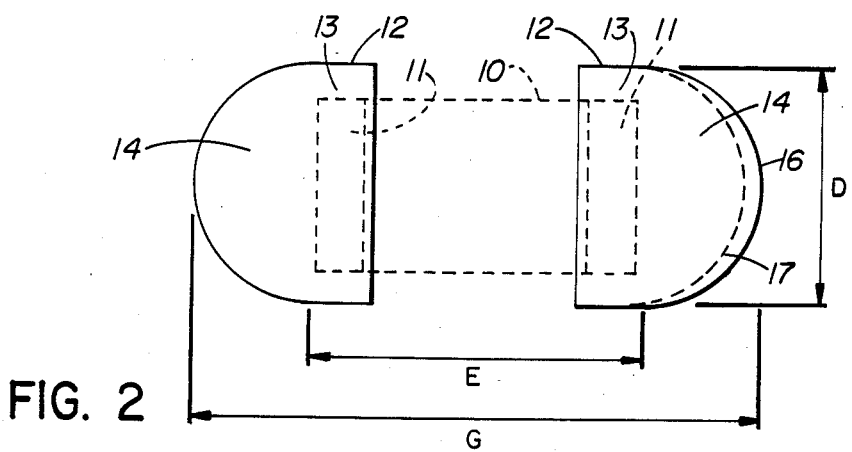
FIG. 2 is an illustration of a mounting position for a device as in FIG. 1.

FIG. 2 illustrates a typical mounting position having two contact pads 12 spaced apart, the device or component indicated in dotted outline at 10. Each pad comprises a rectangular portion 13 and a segmental portion 14. The rectangular portions and the segmental portions are aligned, with the segmental portions being on the outside of the rectangular portions in relation to the position. The tinned contact portions or ends 11 of the device are positioned on the rectangular portions 13.

Figure 3:
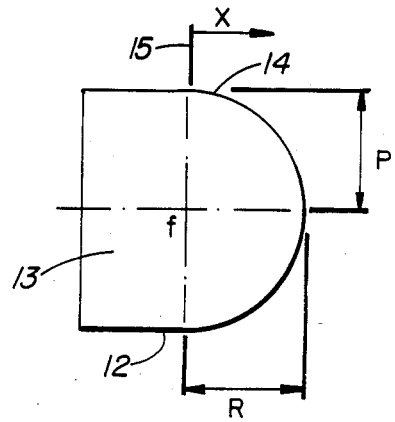
FIG. 3 illustrates an individual pad with the segmental portion parameters.

FIG. 3 illustrates a single pad, with the rectangular portion 13 and segmental portion 14, joining at the chain dotted line 15. The shape of the segmental portion 14 can vary to some extent. The outer edge 16 of the segmental portion is defined by a curve which, preferably is a parabola. A semi-circle will be quite effective but, particularly for relatively large contact pads, occupies more space than a parabola. Also, preferably, the ends of the curved edge 16 and the side edges 17 of the contact pad blend smoothly, the side edges being tangential to the curve. However, this is not essential and is sometimes difficult to obtain in manufacture.

The action of the segmental portion is to centalize the end of the device or component. The process for mounting of components is generally as follows, although variations in the specific process can occur:

1. The circuit board has a circuit pattern defined on one or both surfaces—this is done by conventional means, such as by photolithographic etching;

2. The circuit pattern—generally of copper—is tin plated, this can comprise several steps including a thin copper plating before tin plating, and is conventional;

3. Solder paste is applied, as by screen printing or other conventional method;

4. The solder paste is melted, as by heating the circuit board in a vapour at fusion temperature—generally referred to as reflow soldering—a conventional step or process.

After step 4, the circuit boards has a plurality of solder pads each of which is generally of the form as in FIG. 3, usually arranged in pairs, as in FIG. 2, but also arranged in a row of pairs or in some other pattern. A device is then positioned on the circuit board at each desired position. The actual size of the individual solder pads varies with the size of the device, as described later. The devices are kept in place by the application of a flux to the solder pads prior to positioning of the devices, the flux acting as an adhesive.

The circuit board is then again heated, to melt the solder of the solder pads. Once the solder has melted, then the shape of a pad acts to pull the related end, or contact point, of the device into a central position. This occurs from the effect of the segment of solder in the segmental portion 14. The segment, when molten, because of surface tension, tends to move the related end of the device into alignment with the center or focus f of the segmental portion. The center, or focus, is generally on or close to the junction between the rectangular portion and the segmental portion, that is line 15. The rectangular portion 13 also takes a part in the positioning of the end of the device. Once the solder on this portion is molten it tends to center the device on the center line of the rectangular portion. By having a segmental portion 14 at each end, when they are molten, they also tend to centralize the device, end-to-end, on the two pads. This again occurs because of the surface tension in the molten solder at the segments. The surface tension will be equalized when the longitudinal positioning of the device is symmetrical relative to the focus of each segmental portion.

Figure 1:
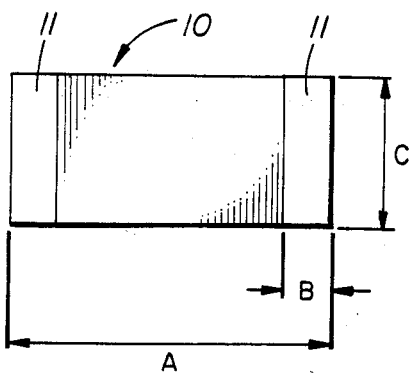
FIG. 1 is an illustration of a device.

FIG. 3 indicates some basis parameters for the segment. The curve of the outer edge is defined by the equation $$Y = \pm \frac{X^2}{2P}$$

where Y is a point on the curve and X and P are distances from the junction line 15 and the distance from an axis normal to the line 15 respectively. Various other parameters apply. Thus, considering FIG. 2, in conjunction with FIG. 1, the distance over the rectangular portions 13—E in FIG. 2—is generally equal to the overall length of the device—A in FIG. 1—plus from approximately 0.02 inches to about 0.03 inches. The width of the pads, that is the width of rectangular portion 12—D in FIG. 2—is generally equal to the width of the device—C in FIG. 1—plus an amount of from about 0.02 inches to about 0.04 inches, the actual amount increasing with the width of the device. The length of the rectangular portion of a pad—F in FIG. 2—is equal to the length of the tinned portion of the device—B in FIG. 1—plus about 0.01 inches. These parameters can vary slightly, and will also be affected slightly by the size of the device. For very small devices, the segmental portion essentially becomes a segment of a circle, while for longer devices it is or approaches a segment of a parabola, which reduces the overall length. The overall length—G in FIG. 2—is determined by E and the effect of the curve or parabola 16. As this curve 16 is dependent to at least some extent on the width C of the device, the length G will thus also be dependent to some extent on the component width. As stated previously, while ideally the curve should blend smoothly with the side of the rectangular portion 13, the side being tangential to the curve, this is not essential, the curve sometimes taking the shape indicated by a dotted line 17 in FIG. 2.

A further feature of the invention is the ability to hold devices in position while the board is reversed, that is with surface mounted devices on the undersurface, while reflow soldering further devices on the top surface. The devices on the bottom surface are held in place, even though the solder is molten.

A typical range of dimensions related to component size is as follows:

|   |   | COMPONENT NUMBER | | | |
|---|---|---|---|---|---|
|   |   | 1812 | 1825 | 1206 | 0805 |
| A |   | .180 | .18 | .12 | .08 |
| C |   | .12 | .25 | .060 | .05 |
| D | ≅ | .16 | .28 | .09 | .07 |
| E | ≅ | .21 | .21 | .15 | .11 |
| F | ≅ | .040 | .07 | .02 | .015 |

What is claimed is:

1. A solder mounting position for an electronic device adapted to be mounted on a substrate surface, comprising at least one pair of solder pads spaced apart along a horizontal axis, each solder pad of substantially uniform thickness and having a rectangular portion with inner and outer edges and an arcuate segmental portion extending from said outer edge of the rectangular portion along said horizontal axis, the inner edges of the rectangular portions being in opposition and the segmental portions extending outward away from each other;

each rectangular portion having a width, measured in a direction normal to said axis, approximately equal to the width of the device plus an amount varying from about 0.02 inches to about 0.04 inches, the amount increasing with increasing width of the device;

each segmental portion having a straight inner edge contiguous with the outer edge of the rectangular portion, and a convex curved outer edge joining at each end to the ends of said inner edge of the rectangular portion.

2. A mounting position as claimed in claim 1, the length of each rectangular portion, in the direction of said axis, being approximately equal to the turned length at the end of the device plus about 0.01 inches.

3. A mounting position as claimed in claim 1, the curved outer edge of each segmental portion approximating to a segment of a circle.

4. A mounting position as claimed in claim 3, the curved outer edge of each segmental portion approximating to a semi-circle.

5. A mounting position as claimed in claim 1, the curved outer edge of each segmental portion approximating a segment of a parabola.

6. A mounting position as claimed in claim 1, the curve of each outer edge of the segmental portions being defined by $$Y = \pm \frac{X^2}{2P}$$

where Y is a point on the curve and X and P are, respectively, distances from said straight inner edge and from said axis.

7. A mounting position as claimed in claim 1, including a plurality of said pairs of solder pads, the axes being parallel.

8. A mounting position as claimed in claim 7, said pairs being aligned in a direction normal to said axes.

* * * * *